United States Patent

Murohara

[19]

[11] Patent Number: 6,089,461
[45] Date of Patent: Jul. 18, 2000

[54] WIRELESS MODULE AND WIRELESS CARD

[75] Inventor: Masaru Murohara, Yokohama, Japan

[73] Assignee: Kabushiki Kaisha Toshiba, Kawasaki, Japan

[21] Appl. No.: 09/096,746

[22] Filed: Jun. 12, 1998

[30] Foreign Application Priority Data

Jun. 20, 1997 [JP] Japan .................................. 9-164481

[51] Int. Cl.⁷ ............................................ G06K 5/00
[52] U.S. Cl. ............................................ 235/492; 235/380
[58] Field of Search .................................. 235/380, 382, 235/492; 257/679

[56] References Cited

U.S. PATENT DOCUMENTS

| | | | |
|---|---|---|---|
| 4,200,227 | 4/1980 | Lemelson | 235/382 |
| 5,153,583 | 10/1992 | Murdoch | 340/825.34 |
| 5,308,967 | 5/1994 | Jurisch | 235/492 |
| 5,424,527 | 6/1995 | Takahira | 235/492 |
| 5,767,772 | 6/1998 | Lemaire et al. | 340/571 |
| 5,880,934 | 3/1999 | Haghiri-Tehrani | 235/492 |

FOREIGN PATENT DOCUMENTS 0 737 935  10/1996  European Pat. Off. .

*Primary Examiner*—Donald Hajec
*Assistant Examiner*—Mark Tremblay
*Attorney, Agent, or Firm*—Pillsbury Madison & Sutro Intellectual Property

[57] ABSTRACT

An antenna has coil windings divided into tiers which are mounted on a wireless module substrate with an integrated circuit (LSI). The coil tiers of the antenna windings are divided into two portions in the vicinity of the LSI. The LSI is positioned between the two divided portions of the antenna. Metal wires are used to connect the terminals of the LSI with both terminals of the antenna for non-contact data communication.

13 Claims, 8 Drawing Sheets

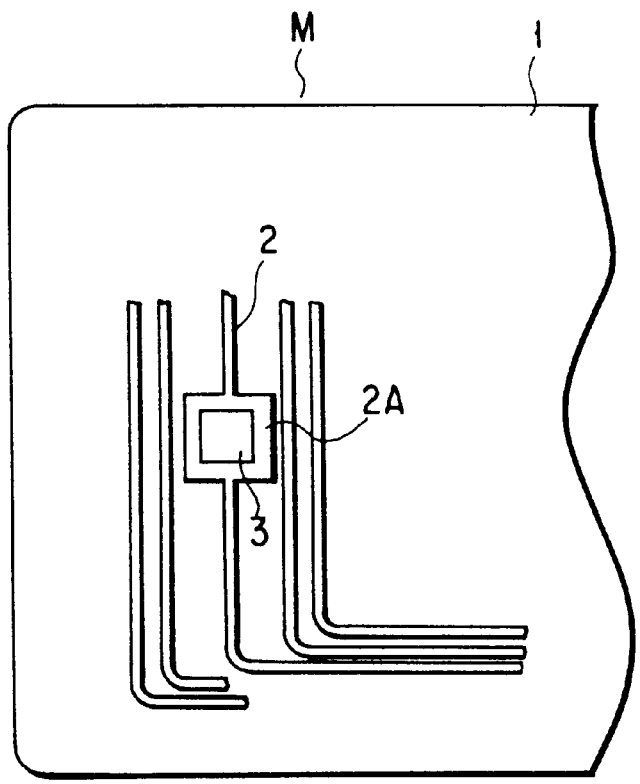
F I G. 9
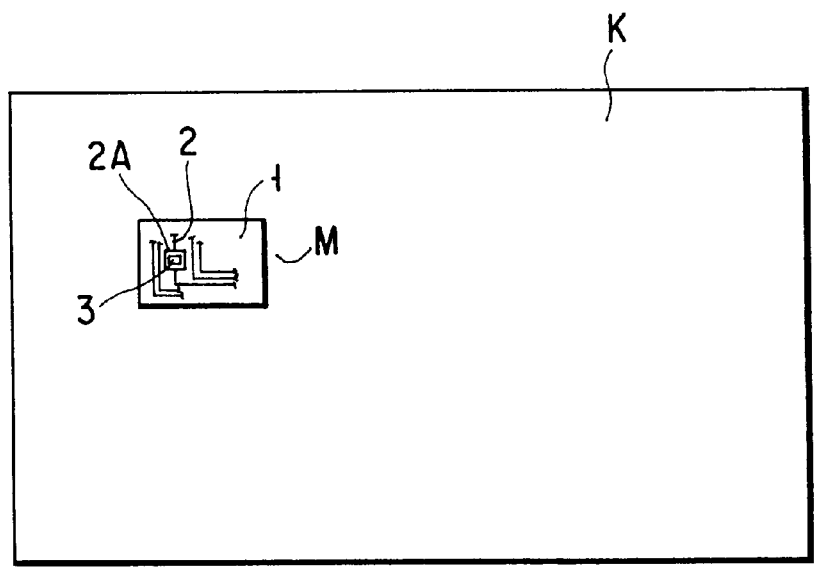
F I G. 10

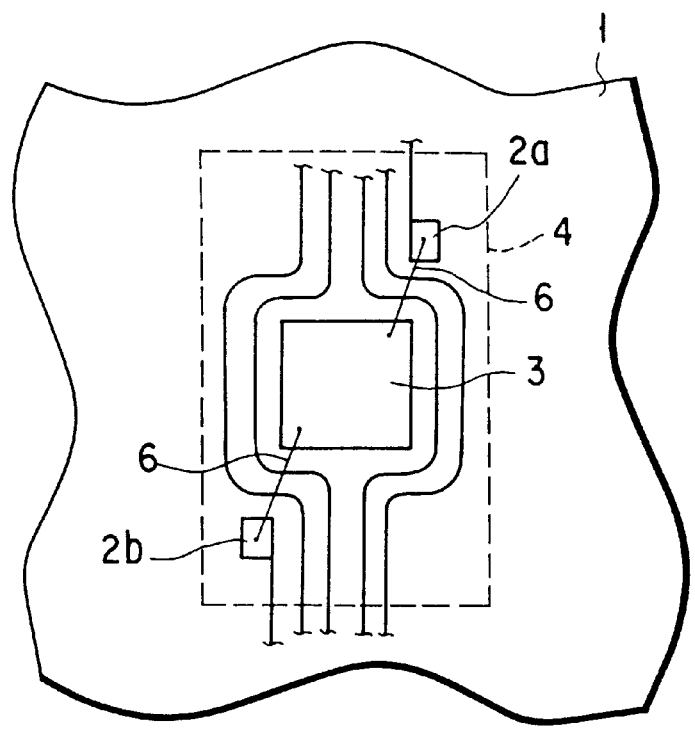
F I G. 11
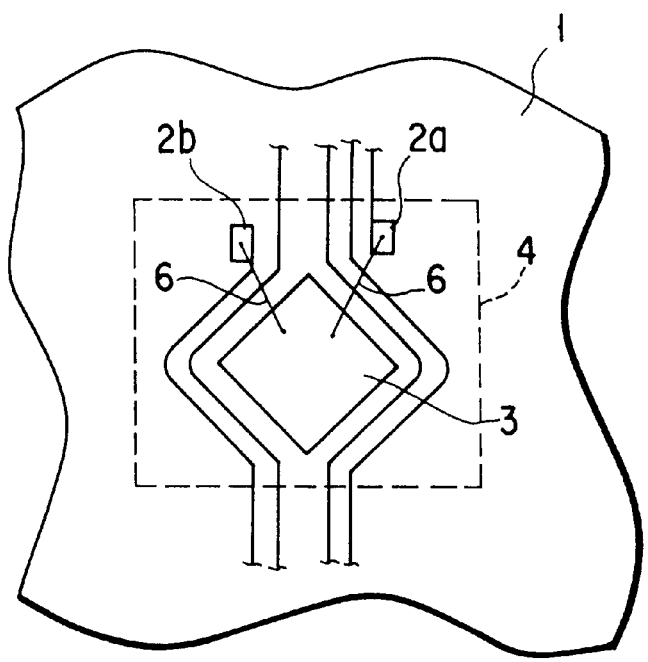
F I G. 12

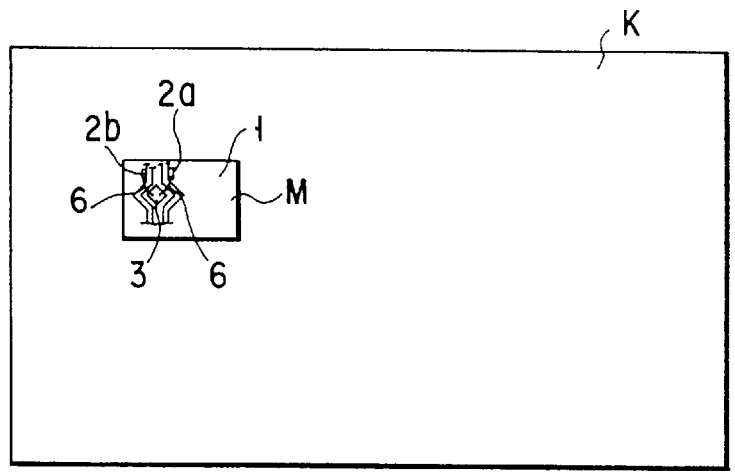
F I G. 13
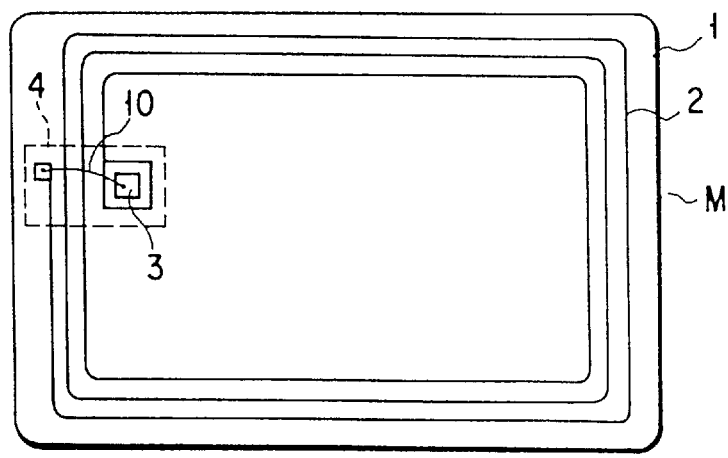
F I G. 14
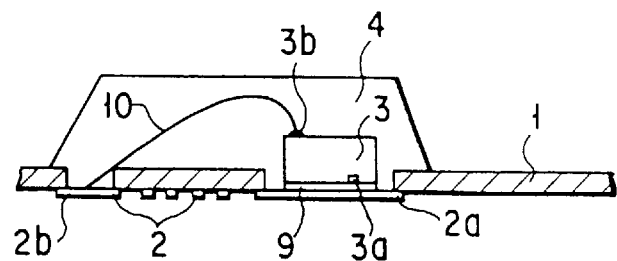
F I G. 15

WIRELESS MODULE AND WIRELESS CARD

BACKGROUND OF THE INVENTION

The present invention relates to a wireless module and a wireless card for use in a thin-layer electronic device involved in non-contact data-communication.

The functional portion of the thin-layer electronic device of this type consists of a wireless module and an antenna, which is a discrete member and connected to the wireless module with a solder or the like. The functional portion consisting of the wireless module and the antenna is incorporated in the card base member which is formed by a molding method or by a laminating method. In this manner, a card is formed.

The wireless module comprises a module substrate and an electronic part such as an LSI (hereinafter, referred to as "LSI") mounted on the module substrate.

However, the wireless module conventionally used does not have an antenna incorporated therein, so that the non-contact data communication cannot be attained.

Hence, to inspect the LSI of the wireless module, an antenna must be connected to the wireless module with a solder or the like. Therefore, disadvantageously long time is required for inspecting the LSI.

The LSI is conventionally positioned on an upper surface of the antenna or in the vicinity of the antenna.

However, if the LSI is positioned on the upper surface of the antenna, the LSI is easily broken along the antenna. If the LSI is positioned in the vicinity of the antenna, the LSI is mistakenly operated by the magnetic field generated from the antenna.

BRIEF SUMMARY OF THE INVENTION

The present invention has been made in view of the aforementioned circumstances. An object of the present invention is to provide a wireless module and a wireless card which makes it possible to attain data communication by itself and to prevent breakage and misoperation of the electronic part.

The wireless module of the present invention comprises:
a module base on which an electronic part is to be mounted; and
an antenna mounted on the module base and connected to the electronic part via terminals arranged at both ends thereof, for attaining non-contact data communication.

Another wireless module of the present invention comprises:
a module base on which an electronic part is to be mounted; and
an antenna mounted on the module base in the form of a coil wound a plurality of times and connected to the electronic part via the terminals arranged at both ends of the antenna, for attaining non-contact data communication,
in which the antenna (coil tiers) is divided into two portions each having a plurality of tiers in the vicinity of the electronic part; the electronic part is positioned between the two divided portions of the antenna, and the terminals of the electronic part are respectively connected to each of terminals of the antenna via a conductive body.

A wireless card of the present invention comprises:
a wireless module including
a module base on which an electronic part is to be mounted; and
an antenna mounted on the module base and connected to the electronic part via terminals arranged at both ends thereof, for attaining non-contact data communication; and
a card base on which the wireless module is to be mounted.

Another wireless card of the present invention comprises:
a wireless module including
a module base on which an electronic part is to be mounted; and
an antenna mounted on the module base and connected to the electronic part via terminals arranged at both ends thereof, for attaining non-contact data communication; and
a card base on which the wireless module is to be mounted,
in which the antenna (coil tiers) is divided into two portions each having a plurality of tiers in the vicinity of the electronic part; the electronic part is positioned between the two divided portions of the antenna, and the terminals of the electronic part are respectively connected to each of terminals of the antenna via conductive bodies.

In the present invention, the wireless module has an electronic part and an antenna mounted together on a module base. It is therefore possible to effect noncontact data communication by using the wireless module alone.

In the present invention, both terminals of the antenna are positioned in the vicinity of the electronic part so as to give a square or a circular shape after they are sealed. It is therefore possible to enhance the strength.

In the present invention, the antenna portion consisting of coil tiers positioned in the vicinity of the electronic part is divided into halves and the electronic part is positioned between the divided antenna portions. It is therefore to cancel out the magnetic fields generated by the antenna at both sides of the electronic part.

A first electrode is provided on the back surface of the electronic part and the first electrode is electrically connected to one of the terminals of the antenna with a conductive adhesive agent; and a second electrode is provided on the front surface of the electronic part and the second electrode is electrically connected to the other terminal of the antenna by a connecting member. It is possible to reduce the number of the connecting member between the electronic part and the antenna.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a plan view showing a fourth installment example an LSI and an antenna on a module substrate;

FIG. 10 is a plan view showing a wireless card with the wireless module of FIG. 9 mounted thereon;

FIG. 11 is a plan view showing a fifth installment example of an LSI and an antenna on a module substrate;

FIG. 12 is a plan view showing a sixth installment example of an LSI and an antenna on a module substrate;

FIG. 13 is a plan view showing a wireless card with the wireless module of FIG. 12 mounted thereon;

FIG. 14 is a plan view showing a wireless module according to a second embodiment of the present invention;

FIG. 15 is a side cross-sectional view showing an installment example of an LSI and an antenna in the wireless module of FIG. 14;

DETAILED DESCRIPTION OF THE INVENTION

Now, the present invention will be explained with reference to an embodiment shown in FIGS. 1 to 5.

Figure 1:
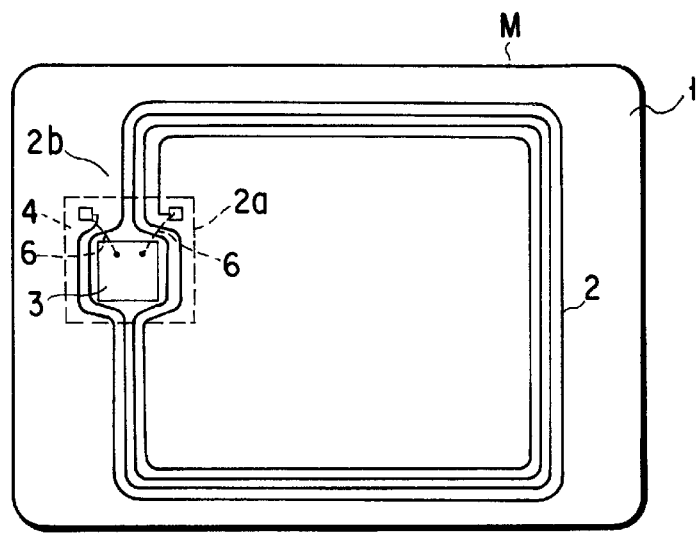
FIG. 1 is a plan view showing a wireless module according to a first embodiment of the present invention.

FIG. 1 is a plan view showing a wireless module M.

The wireless module M has a module substrate 1 as a base. The module substrate 1 is formed of a glass epoxy of 0.2 mm thick. An antenna 2 is mounted on the lower surface of the module substrate 1. The antenna 2 is arranged in the form of a coil wound a plurality of times and integrally attached to the module substrate 1.

Figure 2:
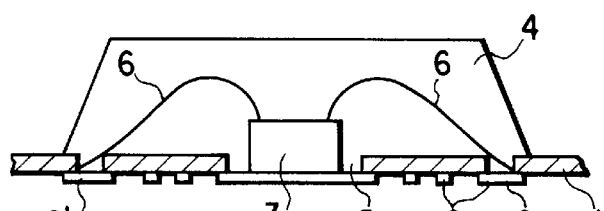
FIG. 2 is a side cross-sectional view showing a first installment example of an LSI and an antenna on a module substrate.

FIG. 2 is a side cross-sectional view showing a first installment example of an LSI 3 and the antenna 2 on the wireless module M.

A device hole 5 is formed through the module substrate 1. An electronic part, an LSI 3 is placed in the device hole 5. Both terminals 2a, 2b of the antenna 2 are connected to the LSI 3 by way of conductive metal wires 6, 6. The LSI 3 and the metal wires 6, 6 are sealed with a resin agent 4. The terminals 2a, 2b of the antenna 2 are respectively abutted against each of the sides of the LSI 3.

The antenna 2 (coil tiers) is arranged in a bundle form until it approaches the LSI 3 and then divided symmetrically into right and left portions (each having uniform numbers of tiers) to avoid overlapping the LSI 3.

Therefore, the metal wires 6, 6 connected to the LSI at one end is connected at the other end to terminals 2a, 2b of the antenna 2 so as to sandwich the antenna tiers. Since the metal wires 6, 6 and both terminals 2a, 2b of the antenna 2 are abutted against LSI 3, the resin-sealed shape of them can be reduced in size.

Figure 3:
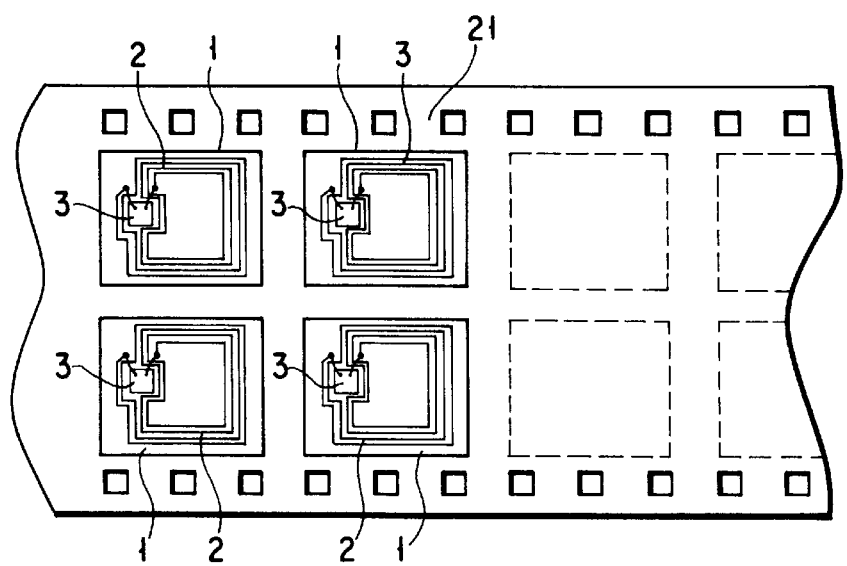
FIG. 3 is a plan view showing a reel base to be used in manufacturing the wireless module.

FIG. 3 is a plan view showing a reel base 21 for use in manufacturing the wireless module M.

The reel base 21 is formed of a glass epoxy substrate of 0.2 mm thick and 35 mm width.

The wireless module M is formed as follows: the LSI 3, the antenna 2, and the metal wires 6, 6 are mounted on the reel base 21 so that two module substrates 1 can be juxtaposed on the reel base 21 in the width direction. Then, the LSI 3 and the metal wires 6, 6 are sealed with the resin agent 4. Thereafter, the reel base 21 is punched out in accordance with an outline shape of the module substrate.

Figure 4:
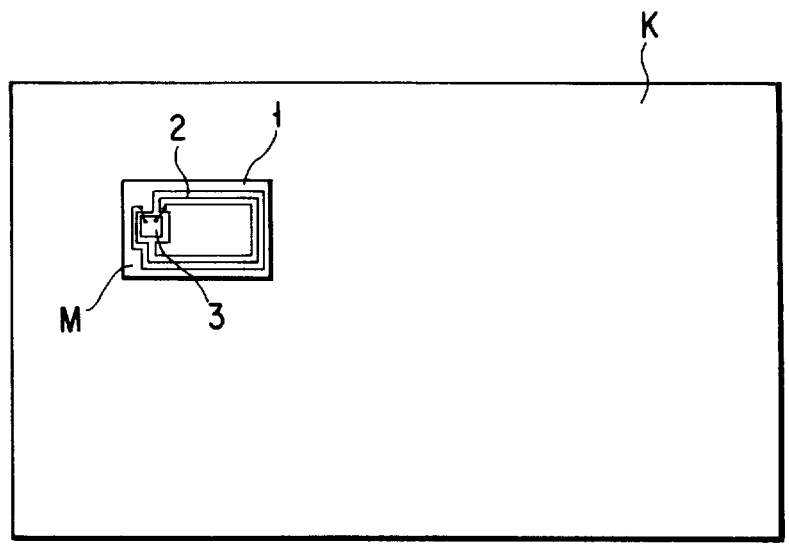
FIG. 4 is a plan view showing a wireless card in which the wireless module of FIG. 1 is to be installed.
Figure 5:
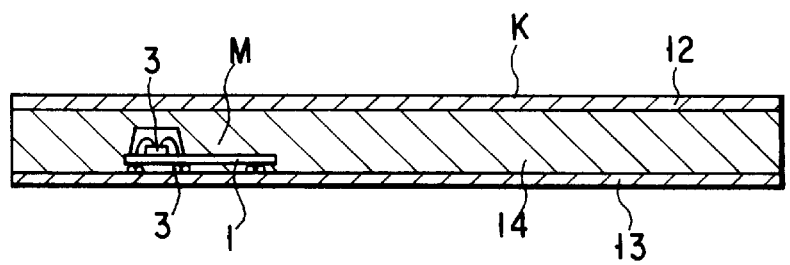
FIG. 5 is a side cross-sectional view showing a wireless card.

FIGS. 4 and 5 respectively show a plan view and a cross-sectional view of a wireless card K.

The wireless card K has a card base 11 incorporating a wireless module M manufactured as described above therein.

The card base 11 consists of front and back sheet materials 12, 13 and a resin layer 14 interposed between the front and back sheet materials 12, 13. The wireless module M is embedded in the resin layer 14. The front and back sheet materials 12, 13 are polyethylene terephthalate (PET) sheets of 100 µm in thickness and respectively adhered onto the front and back surfaces of the resin layer 14 with an adhesive agent 14.

According to this embodiment, the LSI 3 and the antenna 2 are mounted on the module substrate 1 of the wireless module M. It is therefore possible to effect non-contact data communication by using the wireless module alone.

Hence, LSI 3 can be inspected by using the wireless module alone. More specifically, LSI 3 can be inspected without connecting an antenna externally to the wireless module, unlike in the conventional case. This means that the inspection of LSI can be made simpler.

Both terminals 2a, 2b of the antenna 2 are respectively arranged on each of both sides of LSI 3. Therefore, after sealing with the resin agent 4, the sealed shape of both terminals and the antenna takes a symmetrical form such as a square or a circle. As a result, the strength against bending can be improved.

The antenna 2 is arranged in a bundle form until it approaches the LSI 3 and is then divided symmetrically into right and left portions (each having a uniform number of tiers) to avoid overlapping the LSI 3. It follows that magnetic fields generated from the antenna 2 at both sides of the LSI 3 are canceled out each other, preventing misoperation of LSI 3.

Since the LSI 3 is installed by inserting it into the device hole 5, the resultant structure can be reduced by the thickness (0.2 mm) of the module substrate 1.

Figure 6:
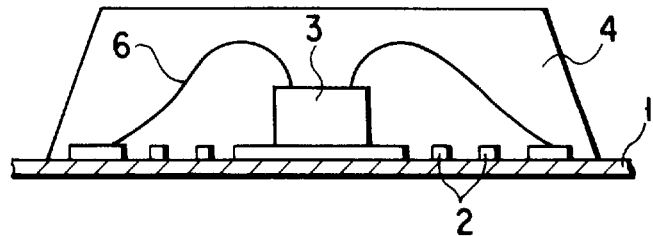
FIG. 6 is a side cross-sectional view showing a second installment example of an LSI and an antenna on a module substrate.

FIG. 6 shows a second installment example of the LSI 3 and the antenna 2 on the module substrate 1.

In this example, the LSI 3 and the antenna 2 are mounted on the upper surface of the module substrate 1. As a result, the resultant structure is formed thicker by the thickness of the module substrate 1, as compared to that of the first installment example.

Figure 7:
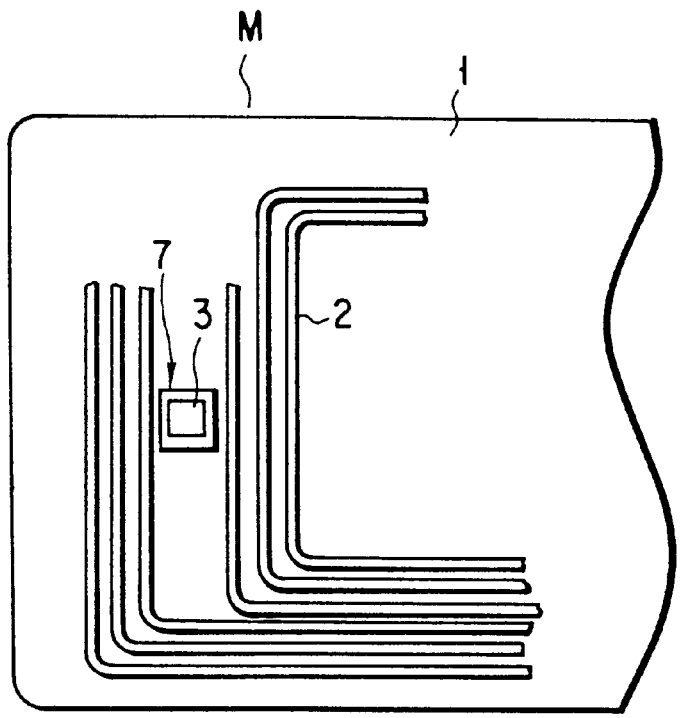
FIG. 7 is a plan view showing a third installment example of an LSI and an antenna on a module substrate.

FIG. 7 shows a third installment example of the LSI 3 and the antenna 2.

In this example, the antenna 2 is arranged in a coil form wound an even number of times (6 times). The antenna coil tiers are divided into right and left halves (three tiers) in the vicinity of the LSI 3. In this embodiment, unlike the first installment example, the antenna 2 is not arranged in a bundle form but arranged in the half-divided form (each having three tiers) before approaching the LSI 3. The LSI 3 are arranged on a solid pattern 7 which is not electrically connected to the antenna 2 and therefore free from effects of antenna 2.

Figure 8:
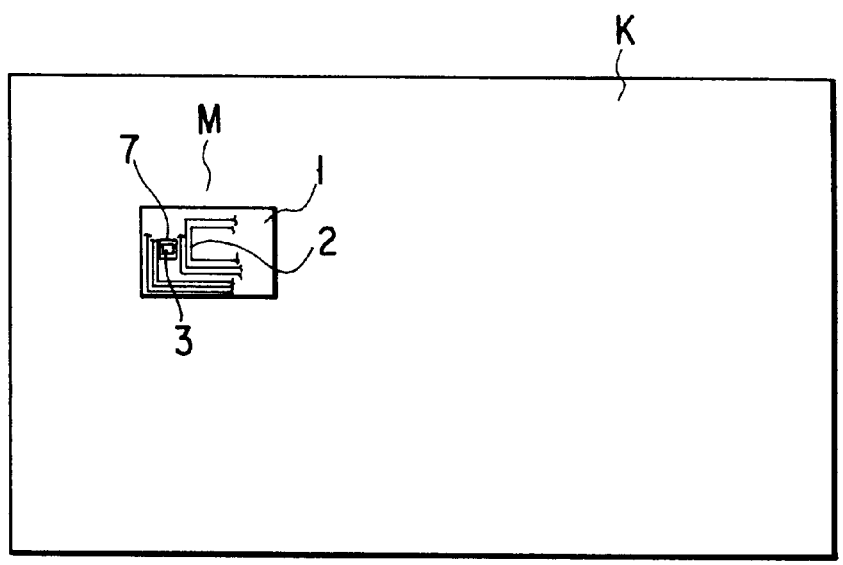
FIG. 8 is a plan view showing a wireless card with the wireless module of FIG. 7 mounted thereon.

FIG. 8 is a fourth installment example of the LSI 3 and the antenna 2.

In this example, the antenna 2 is arranged in a coil form wound an odd number of times (five times). A pattern 2A serving as a mounting base for LSI 3 is formed on a third round tier. The LSI 3 is mounted on the pattern 2A and fixed thereon with an insulating adhesive agent.

FIG. 10 is a plan view showing a wireless card with the wireless module M of FIG. 9 mounted thereon;

FIG. 11 is a fifth installment example of the LSI 3 and the antenna 2. Both terminals 2a, 2b of the antenna are arranged at a far distance around the LSI 3. As a result, the LSI sealed with the resin agent 4 results in a rectangular form.

FIG. 12 is a sixth installment example of the LSI 3 and the antenna 2.

In this example, the LSI 3 is arranged diagonally to the horizontal line so as to appear diamond-shaped and so as to allow a pair of corner portions of LSI facing each other to correspond to the winding shape of the antenna coil tiers. The both terminals 2a, 2b of the antenna 2 are positioned in the vicinity of both sides of one of another pair of corner portions of the LSI 3 so as to sandwich the antenna coil tiers. It follows that the resin-sealed shape of the LSI 3 with the resin agent 4 takes a square, improving the bending strength over the resin-sealed shape of FIG. 11.

FIG. 14 is a plan view showing a wireless module M according to a second embodiment of the present invention.

FIG. 15 is a side cross-sectional view showing an installment example of the LSI 3 and the antenna 2.

In this example, a contact electrode 3a serving as a first electrode is provided on the back surface of the LSI 3. The contact electrode 3a is electrically connected to one of terminals 2a of the antenna 2 with a conductive adhesive agent 9. Furthermore, a pad 3b serving as a second electrode is provided on the upper surface of the LSI 3. The pad 3b is connected to one of terminals 2b of the antenna 2 with a metal wire 10 serving as a conductive connecting member. In this way, a wireless module M attaining wireless communication is formed.

In this example, it is possible to lower latent malfunctions by reducing the connecting portions with a metal wire 10, thereby improving reliability of the LSI 3.

Figure 16:
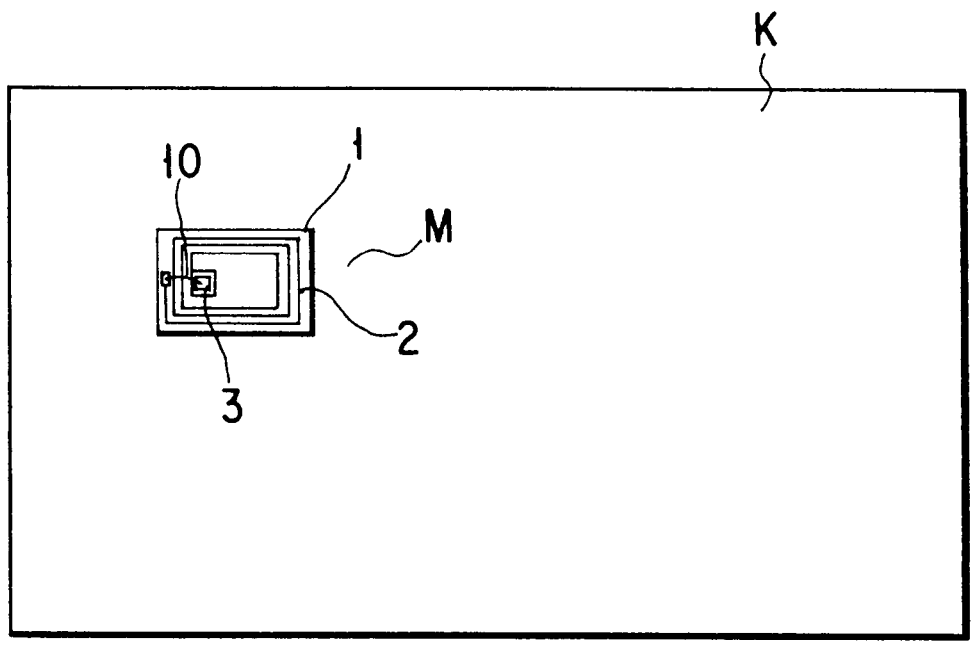
FIG. 16 is a plan view showing a wireless card with the wireless module of FIG. 15 mounted thereon.

FIG. 16 is plan view showing a wireless card with the wireless module M of FIG. 14 mounted thereon.

Figure 17:
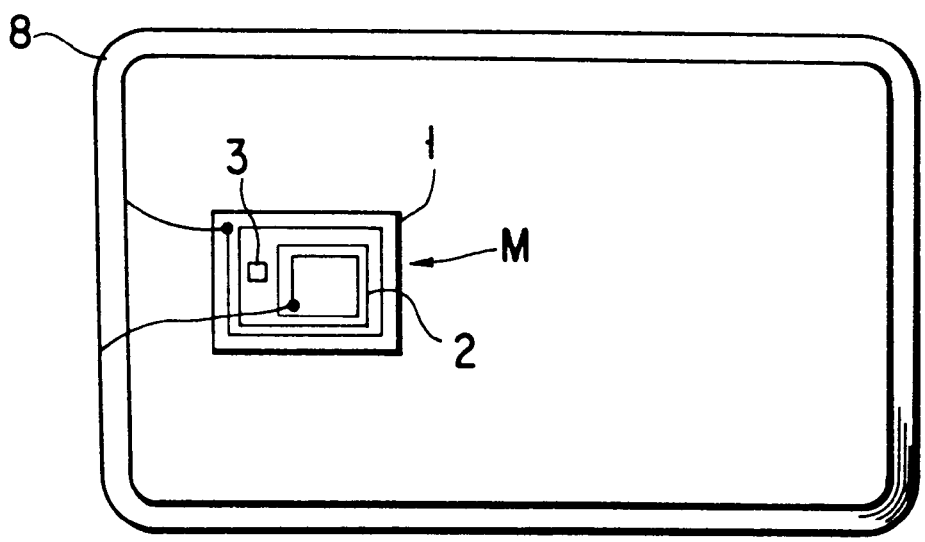
FIG. 17 is a plan view showing a wireless module according to a third embodiment of the present invention.

FIG. 17 is a plan view showing a wireless module M according to a third embodiment of the present invention. In this embodiment, a coil antenna 8 serving as an auxiliary antenna is provided on the antenna 2 mounted on the module substrate 1 of the wireless module M. The coil antenna 8 is larger than the antenna 2. Both ends of the coil antenna 8 are electrically connected to the antenna 2 of the wireless module M with a solder or a conductive paste. As the coil antenna 8, a wind coil is used.

According to the embodiment, the antenna can be formed larger. It is therefore possible to extend a communication distance, drastically.

Figure 18:
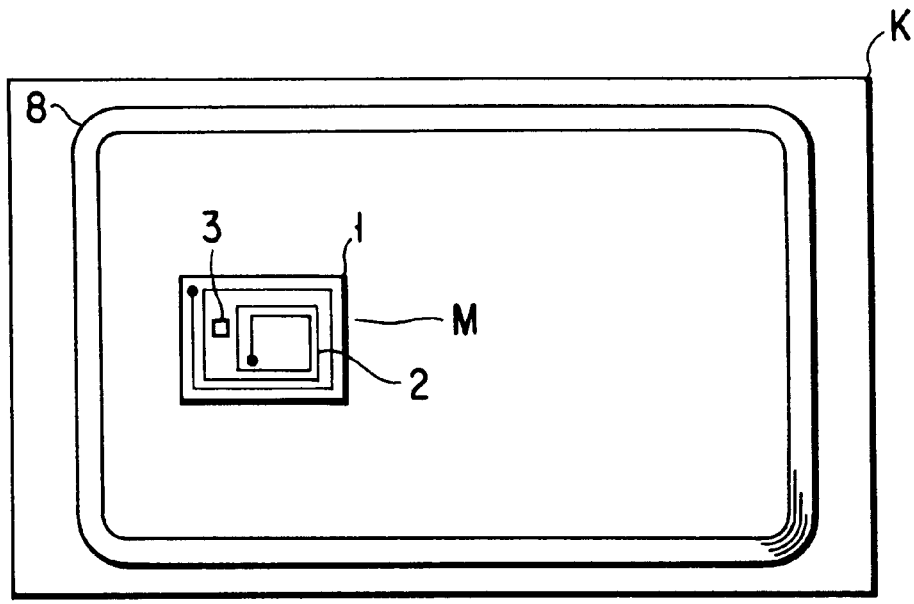
FIG. 18 is a plan view showing a wireless card in which the wireless module of FIG. 17 is to be installed.
Figure 19:
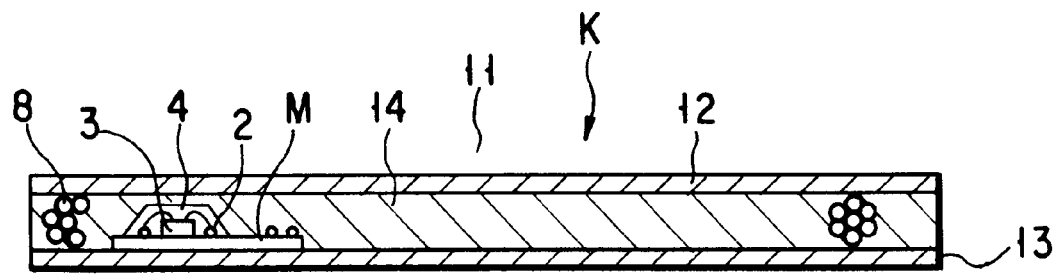
FIG. 19 is a side cross-sectional view showing a wireless card of FIG. 18.

FIGS. 18 and 19 are respectively a plan view and a side cross-sectional view of a wireless card K in which a wireless module M of FIG. 17 is installed.

A card base 11 of the wireless card K consists of frond and back sheet materials 12, 13 and a resin layer 14 interposed between the front and back sheet materials 12, 13, similarly to the case shown in FIG. 5. The wireless module M of FIG. 17 and the coil antenna 8 are embedded in the resin layer 14.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wireless module, comprising:
    a module base;
    an electronic part mounted on said module base, said electronic part having a first electrode attached to a rear surface thereof and a second electrode attached to a front surface thereof; and
    an antenna mounted on said module base, said first electrode being connected to a first terminal of said antenna via a conductive adhesive, and said second electrode being connected to a second terminal of said antenna via a metal wire.

2. A wireless module comprising:
    a module base on which an electronic part is to be mounted; and
    an antenna mounted on the module base in the form of a coil wound a plurality of times and connected to the electronic part via the terminals arranged at both ends of the antenna, for attaining non-contact data communication,
    wherein the antenna (coil tiers) is divided into two portions each having a plurality of tiers in the vicinity of the electronic part; the electronic part is positioned between the two divided portions of the antenna, and the terminals of the electronic part are respectively connected to each of terminals of the antenna via conductive bodies.

3. The wireless module according to claim 2, wherein the antenna is arranged in the form of a coil wound an even number of times and divided into halves in the vicinity of the electronic part, thereby sandwiching the electronic part.

4. The wireless module according to claim 2, wherein the antenna is arranged in the form of a coil wound an odd number of times, a central tier of the coil is located under a mounting portion for the electronic part, other tiers are divided into halves so as to sandwich the mounting portion for the electronic part therebetween, and the electronic part is mounted on the mounting portion with an insulating adhesive agent.

5. The wireless module according to claim 2, wherein the terminals of the electronic part are connected to the terminals of antenna respectively at the outer sides of the antenna coil tiers via a connecting member so as to sandwich the antenna coil tiers.

6. The wireless module according to claim 2, wherein one pair of corner portions of the electronic part facing each other are allowed to correspond the winding shape of the antenna coil tiers and the antenna terminals are connected to the terminals of the electronic part via a connecting member at one of another pair of corner portions.

7. A wireless card, comprising:
    a wireless module including:
        a module base;

an electronic part mounted on said module base, said electronic part having a first electrode on a back surface thereof and a second electrode on a front surface thereof; and an antenna mounted on said module, said first electrode being connected to a first terminal of said antenna via a conductive adhesive, and said second electrode being connected to a second terminal of said antenna via a metal wire, a card base for mounting said wireless module.

8. The wireless card according to claim 7, further comprising:

an auxiliary antenna mounted on said card base and connected to said antenna of said wireless module, said auxiliary antenna having a different size from said antenna.

9. A wireless card comprising:

a wireless module including a module base on which an electronic part is to be mounted; and an antenna mounted on the module base and connected to the electronic part via terminals arranged at both ends thereof, for attaining non-contact data communication; and a card base on which the wireless module is to be mounted, wherein the antenna (coil tiers) is divided into two portions each having a plurality of tiers in the vicinity of the electronic part; the electronic part is positioned between the two divided portions of the antenna, and the terminals of the electronic part are respectively connected to each of terminals of the antenna via conductive bodies.

10. The wireless card according to claim 9, wherein the antenna is arranged in the form of a coil wound an even number of times and divided into halves in the vicinity of the electronic part so as to sandwich the electronic part therebetween.

11. The wireless module card according to claim 9, wherein the antenna is arranged in the form of a coil wound an odd number of times, a central tier of the coil is located under a mounting portion for the electronic part, other tiers are divided into halves so as to sandwich the mounting portion for the electronic part, and the electronic part is mounted on the mounting portion with an insulating adhesive agent.

12. The wireless card according to claim 9, wherein the terminals of the electronic part are connected to the terminals of antenna respectively at the outer sides of the antenna coil tiers via a connecting member so as to sandwich the coil tiers.

13. The wireless card according to claim 9, wherein one pair of corner portions of the electronic part facing each other are allowed to correspond the winding shape of the antenna coil tiers and the antenna terminals are connected to the terminals of the electronic part via a connecting member at one of another pair of corner portions.

* * * * *